United States Patent
Vuksic

(12)
(10) Patent No.: US 6,456,089 B1
(45) Date of Patent: Sep. 24, 2002

(54) METHOD FOR TESTING ELECTRICAL MODULES

(75) Inventor: Antun Vuksic, München (DE)

(73) Assignee: Siemens Aktiengesellschaft (DE)

( * ) Notice: Subject to any disclaimer, the term of this patent is extended or adjusted under 35 U.S.C. 154(b) by 0 days.

(21) Appl. No.: 09/530,176

(22) PCT Filed: Oct. 30, 1998

(86) PCT No.: PCT/DE98/03181
§ 371 (c)(1),
(2), (4) Date: Apr. 25, 2000

(87) PCT Pub. No.: WO99/23500
PCT Pub. Date: May 14, 1999

(30) Foreign Application Priority Data

Oct. 30, 1997 (DE) .......................... 197 48 029

(51) Int. Cl.⁷ .................... H01H 31/02; G01R 31/08
(52) U.S. Cl. .................. 324/537; 324/73.1; 324/512; 324/754
(58) Field of Search ................ 324/754, 755, 324/756, 758, 158.1, 73.1, 537, 512, 519, 525

(56) References Cited

U.S. PATENT DOCUMENTS

| | | | |
|---|---|---|---|
| 4,550,406 A | * 10/1985 | Neal | ................ 371/20 |
| 4,565,966 A | * 1/1986 | Burr et al. | ................ 324/73 PC |
| 5,006,808 A | 4/1991 | Watts | ................ 324/537 |
| 5,504,432 A | 4/1996 | Chandler et al. | ................ 324/537 |

FOREIGN PATENT DOCUMENTS

| | | |
|---|---|---|
| DE | 27 04 783 | 8/1978 |
| DE | 34 08 704 | 9/1984 |
| DE | 41 09 684 | 1/1992 |
| DE | 41 36 061 | 5/1992 |
| GB | 2 307 754 | 6/1997 |
| JP | 61-180153 | 8/1986 |
| JP | 09-230005 | 9/1997 |

* cited by examiner

*Primary Examiner*—Michael Sherry
*Assistant Examiner*—Paresh Patel
(74) *Attorney, Agent, or Firm*—Harness, Dickey & Pierce PLC

(57) ABSTRACT

For speeding up the short-circuit and component test phase when testing electrical modules on a flying probe tester that includes contacting elements movable in all directions over a respective line networks of the electrical module, it is proposed that, at the beginning of the testing phase, such groups of contact points be contacted. Further, a respective line network-to-ground/potential connection for respective measurement threat is produced with respect to all line networks occurring on the electrical module under test.

5 Claims, 1 Drawing Sheet

METHOD FOR TESTING ELECTRICAL MODULES

This application is the national phase under 35 U.S.C. § 371 of PCT International Application No. PCT/DE98/03181 which has an International filing date of Oct. 30, 1997, which designated the United States of America, the entire contents of which are hereby incorporated by reference.

FIELD OF THE INVENTION

The present invention relates to a method for testing electrical modules.

BACKGROUND OF THE INVENTION

Electrical modules must be tested before their release. On a known testing machine, which is referred to as the flying probe tester, the electrical modules to be tested are tested without supply voltage.

The flying probe tester comprises contacting elements for producing electrical contacts with contacting points of the electrical module to be tested. The contacting elements nearly "fly"—as the name of the testing machine already suggests—back and forth over the electrical module under test and successively contact respectively prescribed groups of contact points on the electrical module under test in order to measure electrical quantities such as resistance, capacitance and inductance thereat. On the basis of the measured values and dependent on the location of the measured values, the test program then diagnoses short-circuits between line networks as well as components on the electrical module under test that are incorrect, not present at all or incorrectly contacted. The events described above sequence in what are referred to as short-circuit or component tests and are also often referred to in this way below.

Within the tests, the individual test types can be classified as indicated in the following enumeration:

1. Short-circuit test
2. Component test
3. Open test, i.e., test for missing components or incorrectly contacted components.

The test machine must execute what are referred to as motion steps for the tests. Motion steps are steps wherein the test machine brings the contacting elements to and contacts the groups of contacting points to be contacted on the electrical module under test. After the contacts have been produced, the test machine implements one or more testing steps in which it measures one or more of the aforementioned electrical quantities and interprets them dependent upon the location of the measurement.

Dependent on the type of electrical module, electrical modules can comprise 200 resistance, capacitance and inductance components on average and can have 500 line networks with which the components are connected to one another. A line network comprises both the lines to the individual components as connection element between the components as well as the components pins with all galvanically connected elements inside the component.

Further, the electrical modules can have line networks arranged on the electrical module such that, on average, one line network has respectively 5 neighboring networks to which a short can respectively occur.

In order to assure freedom from shorts in previous short-circuit and component testing methods, measurements are carried out between all line networks and respectively all line networks coming into consideration per line network for a short. The measurements for implementing the component test then follow. A separate motion step is executed for each measurement, particularly for each measurement in the short-circuit test phase. In terms of motion steps for the short-circuit and component test, this means (500 LN) * (5 neighboring LN)=2,500 for short-circuit test
200 components=200 for element test,
LN denotes: line network, with reference to the aforementioned example of a specific type of electrical module.

The motion steps to be accomplished by the flying probe tester therefore amount to 2,7000 motion steps.

The flying probe tester is not especially fast because of the mechanical movements of the contacting elements. Nonetheless, it is well-suited for electrical modules that are issued in small numbers of units in order to subject these to short-circuit and component tests. The flying probe tester can be programmed relatively fast and simply and is therefore valuable for this type of electrical module.

U.S. Pat. No. 5,006,808 discloses a testing method for unequipped modules wherein a flying probe tester is employed for testing. The main test of the module ensues via capacitance measurements between the individual line networks. When the measurements exhibit unanticipated values, supplementary resistance measurements are implemented. The known method does not enable the testing of arbitrarily equipped modules with comparatively few testing steps.

Japanese Patent Application No. 61 180 153 discloses a testing method for testing equipped modules. The testing, however, does not ensue with a flying probe tester. Moreover, the modules to be tested therein comprise only line networks that have measurable resistances. Capacitance and/or inductance measurements are not taken into consideration here. The document is therefore limited to testing resistor networks. A testing of arbitrarily equipped modules with comparatively few testing steps is also not possible with this document.

SUMMARY OF THE INVENTION

It is therefore an object of the present invention to reduce the number of motion steps in the short-circuit and component testing of arbitrarily equipped electrical modules while retaining the complete freedom from shorts.

The object is inventively achieved in accordance with the present invention in a method for testing modules.

In accordance therewith, a number of motion steps in the short-circuit test may be limited to the number of existing line networks. When no fault is discovered with these motion steps, the freedom from shorts may thus automatically be assured overall. The freedom from shorts was previously obtained only by measuring between all respectively neighboring line networks. A reason for the limitation to the handful of motion steps in the present method is the possibility of short-circuit statements on the basis of the electrical quantities obtained in the measurements at the respective, individual line networks with reference to an existing ground reference point or to a respectively pertaining reference potential. On the occasion of these measurements and without additional motion steps, moreover, components are co-tested to a certain extent either immediately or, on the other hand, with merely a further testing step having a slight additional measuring time, for example a test for a predetermined capacitance value in addition to a test for a predetermined resistance value. Respectively separate motion steps are thus needed for obtaining each of these items of information. These are only necessary in order to be able to diagnose the fault when particular constellations of faults are present. Since it can be assumed that a high degree of production quality prevails in a fabrication, such additional measurements are only rarely required. In the previous short-circuit testing method, additional measurements were a constituent part of the measurement program. The present inventive method of the short-circuit and component test also has the advantage that the testing time can be kept short in that an optimum path, i.e., a path that includes a shortest distance overall, can be adhered to in the processing of the individual measurements at the respective line networks referred to ground/potential.

In accordance therewith, supplementary testing steps with their respectively own motion steps can in fact be necessary in certain special fault instances. These, however, are limited to those line networks whereat the faults occurred. Only a few supplementary testing and motion steps therefore need be implemented.

The fact that the tests are always implemented with the same reference point (ground/potential) has the advantage that a single contacting element can be employed for respectively all tests in conjunction with this reference point. I.e., the contacting element allocated to this reference point can be kept at the reference point during the various measurements without a motion step.

The inherently known, simple methods of resistance, capacitance and inductance measurement suffice for the implementation of the individual testing tests, so that no added outlay for the measuring is required compared to that previously known.

BRIEF DESCRIPTION OF THE DRAWINGS

These and other features of the invention will become clearer with reference to the following detailed description of the preferred embodiments and the accompanying drawings, wherein.

DETAILED DESCRIPTION OF THE PREFERRED EMBODIMENTS

Figure 1:
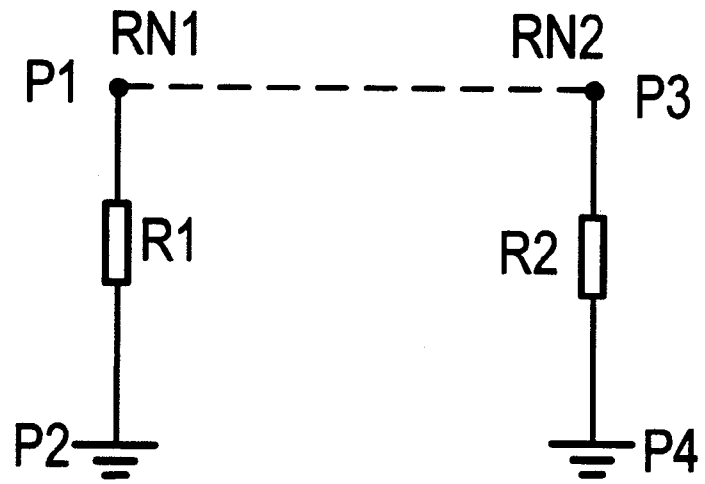
FIG. 1 is an electrical schematic diagram showing a few line networks respectively constructed only with resistors with a short-circuit connection indicated therein.

FIG. 1 shows two resistance line networks RN1 and RN2. The resistance line network RN1 comprises, for example, a single resistor R1 as equivalent circuit diagram, and the resistance line network RN2 likewise comprises a single resistor R2 as equivalent circuit diagram. Let it thereby be assumed that the values of the resistors R1 and R2 are of the same size and respectively amount to 100 Ω.

The resistors R1 and R2 are connected to ground. However, it can also be assumed that the ground point serving as reference point here can also be a reference point lying at a potential. This point is therefore also sometimes referred to as ground/potential in the present explanations.

When the two line networks RN1 and RN2 comprise a short-circuit at their sides lying opposite the ground point, a resistance value of 50 Ω can be respectively measured in measurements at the two line networks RN1 and RN2.

The short is indicated in FIG. 1 with a broken-line connecting line between the two line networks RN1, RN2. The points P1 and P2 are responsible for the measurement at the line network RN1. The points P2 and P4 are responsible for the measurement at the line network RN2.

It is to be assumed that the structure of an electronic module to be tested is known; it is also to be assumed that what values are to be obtained at which locations given corresponding measurements are known. Since, however, only 50 Ω instead of 100 Ω were measured in the present case, it is thus known that a short-circuit is present between the line networks RN1 and RN2.

When the resistors R1 and R2 of the two line networks RN1 and RN2 exhibit different values of resistance, the resulting modification due to the short is more pronounced at the high-impedance line network. Given great differences in the values of resistance, for example when the value of resistance of the resistor R1 of the line network RN1 amounts to 100 Ω and the resistor R2 of the line network RN2 amounts to 10 Ω, a significant change can only be measured at the line network RN2 with the high-impedance resistor R2. In order to nonetheless enable the diagnosis of the two line networks, a known method with the test of neighboring line networks, i.e., a short-circuit measurement between the pertaining, neighboring line networks, can be additionally implemented in this case.

Figure 2:
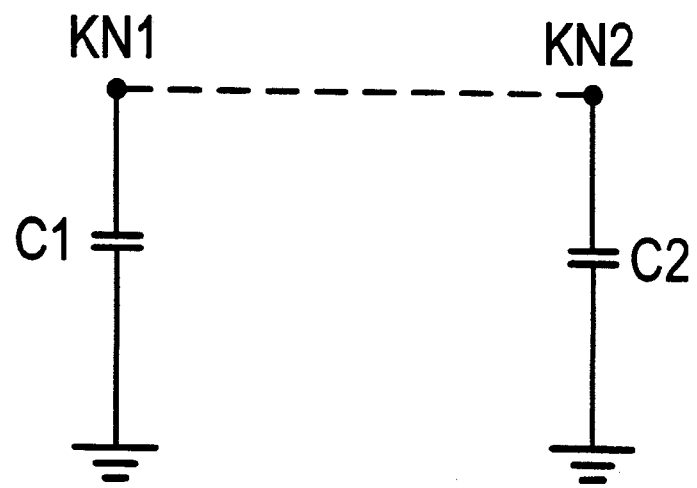
FIG. 2. is an electrical schematic diagram showing a few line networks respectively constructed only with capacitors with a short-circuit connection indicated therein.

FIG. 2 shows an exemplary embodiment with line networks KN1 and KN2 that have no resistor at ground/potential. Measurements of the line networks KN1 and KN2 without a resistor at ground/potential are acquired by measurements of the network capacitances C1 and C2. The network capacitances C1 and C2 derive from:

$$C_N = l * C' + PINPLUR * C_{pin}$$

with
l line length
C' capacitance per length unit (pF/cm)
PINPLUR number of electrical components at the line network
$C_{pin}$ capacitance of the component inputs and outputs
N number of the line network or of the network capacitance.
In the present exemplary embodiment, let the network capacitance C1 of the line network KN1 be 30 pF and the network capacitance C2 of the line network NK2 to be 40 pF.

When a short-circuit again graphically indicated in FIG. 2 by a broken-line connecting line between the line networks KN1 and KN2 a the sides lying opposite the ground/potential terminal side is assumed, capacitances of 70 pF are measured at the two line networks KN1 and KN2. Since, however, 30 pF and 40 pF are anticipated in the line network measurements, it is clear that a short between the line networks KN1 and KN2 is present.

In order to acquire the short-circuits between, for example, line networks with resistors and line networks with capacitors, a high-impedance test is also undoing the current contacting. When, for example, a resistance value of >100 kΩ derives in this test, it can be derived therefrom that no short-circuit to another line network is present.

In summary, the following can be stated given employment of the present disclosed method in short-circuit and component tests on a flying probe tester:

a) The number of motion steps is reduced. For example, only 500 motion steps instead of 2,500 motion steps are required in the fault-free case given electrical modules under test having 500 line networks and an average of respectively 5 neighboring line networks.

b) Shorter paths are obtained in the movement of the contacting elements of the test machine. Given a geometrically optimum sequence of the line network tests, an average distance of 1 to 2 cm between two line networks is present.

c) The contacting elements of the test machine can be utilized better. Given a test machine having, for example, 4 contacting elements, 3 contacting elements can be simultaneously utilized with the inventive method. One contacting element contacts ground/potential in common for the others. When a test is implemented between two neighboring line networks, 2 contacting element pairs can simultaneously implement the measurements, whereby the contacting element for ground/potential can simultaneously serve for the one and other measurement.

d) The tests at the line networks with resistors have a double effect. The resistance values and the freedom from shorts at the line network are simultaneously checked with the tests at these line networks. The number of testing steps in the component test is therefore reduced to the number of components that have no connection to ground/potential.

There is no longer any need for the potentially complex determination of neighboring line networks that is usually affected by compromises because the freedom from shorts between each line network and all respectively other line networks can also assured with the disclosed short-circuit and component test.

What is referred to as a diode test can be implemented at every line network without substantially lengthening the testing time. A diode test is a test for continuity.

For example, the testing time for a line network lies at 10 ms. The motion time of the contacting elements lies, for example, in the range from 100 to 200 ms/line network. If additional testing tests should become necessary, these are of practically no consequence compared to the motion time.

A pre-condition for the recognition of missing components is that at least one terminal leg at the component has no connection to further components.

The upper limit is monitored for the test of freedom from shorts given capacitative line networks. This limit is downwardly transgressed in case of a short. When the lower limit is also tested, missing components having a relatively high pin capacitance, for example 10 pF, as well as interruptions having considerable effects on the line network capacitance can be covered.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. A method for testing modules comprising electrical components, without connection to a supply voltage, on a test machine comprising a number of contacting elements movable in all directions for producing electrical contacts with contact points belonging to respective line networks of the module being tested and with which, in a short-circuit and component test phase, groups of contact points of the modules are successively contacted and electrical quantities are measured by said test machine for detecting shorts and faulty components on the electrical modules, the method comprising the steps of:

at a beginning of the short-circuit and component test phases, successively implementing measurements at all possible line networks of the module by respectively referring to a pertaining ground/potential point and by contacting successively occurring groups of contact points; and measuring values with said test machine, given a measurement at a line network having at least one of resistances, capacitances, and inductances, of said at least one of resistances, capacitances, and inductances of the line network between said ground/potential and appertaining said contact points, wherein line network ground/potential measurements are implemented by contacting groups of contact points at line networks that have a common, pertaining ground/potential point; and said method further comprising the step of fixing a contact to said common ground/potential point for multiple measurements.

2. The method according to claim 1, further comprising the step of:

implementing independent measurements between two line networks, either sequentially or simultaneously with multiple said contacting elements, by supplementary contacting groups of contact points, a first of said line networks being a line network for which a significantly different value than anticipated has been measured between the first line network and a pertaining ground/potential point in a preceding measurement, and a second of said line networks being a line network arranged neighboring said first line network on the module.

3. The method according to claim 1, further comprising the step of:

given a measurement between a line network and a pertaining ground/potential point between which only capacitances are arranged, implementing a high-impedance measurement in addition to a capacitance measurement.

4. The method according to claim 1, further comprising the step of:

given a measurement between a line network and a pertaining ground/potential point between which only capacitances are arranged, measuring a highest allowed value of capacitance.

5. The method according to claim 1, further comprising the step of:

given a measurement between a line network and a pertaining ground/potential point between which only capacitances are arranged, measuring a lowest allowed value of capacitance.

* * * * *